United States Patent
Yang et al.

(10) Patent No.: US 8,203,171 B2
(45) Date of Patent: Jun. 19, 2012

(54) DEFECTIVE GRAPHENE-BASED MEMRISTOR

(75) Inventors: Joshua Yang, Palo Alto, CA (US); Feng Miao, Mountain View, CA (US); Wei Wu, Palo Alto, CA (US); Shih-Yuan Wang, Palo Alto, CA (US); R. Stanley Williams, Portola Valley, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 205 days.

(21) Appl. No.: 12/754,300

(22) Filed: Apr. 5, 2010

(65) Prior Publication Data

US 2011/0240947 A1 Oct. 6, 2011

(51) Int. Cl.
*H01L 29/74* (2006.01)
(52) U.S. Cl. ........ 257/107; 257/130; 257/393; 257/444; 257/E29.001; 977/734
(58) Field of Classification Search .................. 977/734; 257/3, 107, 130, 393, 444, E29.001, E47.001
See application file for complete search history.

(56) References Cited

U.S. PATENT DOCUMENTS

| | | | |
|---|---|---|---|
| 2005/0035367 A1* | 2/2005 | Bertin et al. | ............... 257/107 |
| 2006/0049390 A1 | 3/2006 | Ufert et al. | |
| 2010/0006811 A1 | 1/2010 | Xu et al. | |

OTHER PUBLICATIONS

Kyaw Sint, et al. "Selective Ion Passage through Functionalized Graphene Nanopores" Jun. 10, 2008. J. Am. Chem. Soc. 2008, 130. pp. 16448-16449, United States.
O. Leenaerts, et al. "Graphene: A perfect nanoballoon" Sep. 11, 2008. Applied Physics Letters 93. pp. 193107-1-193107-3, Belgium.
T.J. Echtermeyer, et al. "Non-volatile switching in graphene field effect devices" Advanced Microelectronic Center Aachen (AMICA). pp. 1-14, Germany.

* cited by examiner

*Primary Examiner* — Michelle Mandala

(57) ABSTRACT

A graphene-based memristor includes a first electrode, a defective graphene layer adjacent the first electrode, a memristive material that includes a number of ions adjacent the defective graphene layer, a second electrode adjacent the memristive material, and a voltage source that generates an electric field between the first and the second electrodes. Under the influence of the electric field, ions in the memristive material form an ion conducting channel between the second electrode and the defective graphene layer.

17 Claims, 3 Drawing Sheets

DEFECTIVE GRAPHENE-BASED MEMRISTOR

STATEMENT OF GOVERNMENT INTEREST

This inventions disclosed herein have been made with U.S. Government support under Contract Number HR001-09-3-0001 awarded by the Defense Advanced Research Projects Agency (DARPA). The U.S. Government has certain rights in these inventions.

BACKGROUND

Memristive devices (or simply memristors) are a class of electrical components that potentially can be used for a variety of functions including as switches in electronic circuits and as non-volatile memory. Memristors include two-terminal devices in which the magnetic flux between the terminals is a function of electric charge passed through the device.

Memristors may be molecular- or nano-scale devices. When used in electronic circuits and non-volatile memory, such a nano-scale memristor may incorporate a single-atom thick layer of graphite, normally referred to as graphene. Under certain conditions, the graphene layer may form a barrier to the movement of ions between the terminals. To make this memristor operate as a switch or as non-volatile memory, some mechanism may allow the transport of ions through the graphene layer.

DESCRIPTION OF THE DRAWINGS

The Detailed Description will refer to the following drawings in which like numerals refer to like items, and in which.

DETAILED DESCRIPTION

Figure 1:
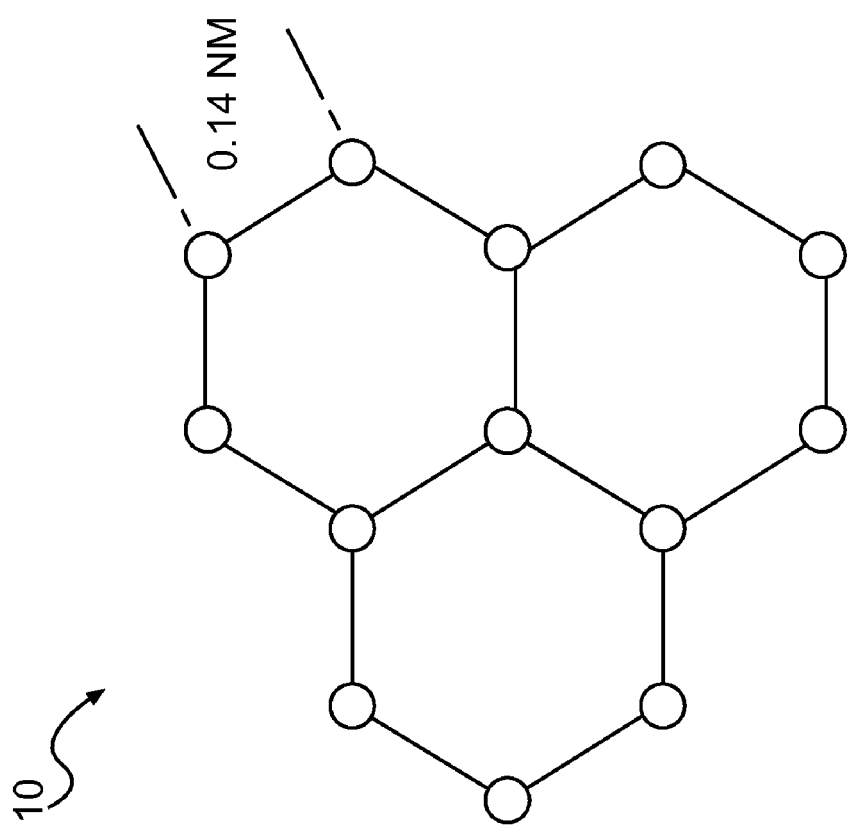
FIG. 1 illustrates a graphene layer.

In general terms, a memristor is a circuit element that maintains a functional relationship, called memristance, between time integrals of current and voltage. As disclosed herein, a specific implementation of memristor technology involves a switching memristor that employs a thin film of titanium dioxide, and has a regime of operation with an approximately linear charge-resistance relationship. Such a switching device has application in nano-electronic memories: devices that are so small that inter-atomic interactions and quantum mechanical properties apply. The same switching devices also may find application in computer logic and neuromorphinic computer architectures (e.g., very large scale integration (VLSI) systems containing electronic analog circuits that mimic neuro-biological architectures present in the nervous system) and analog, digital or mixed-mode analog/digital VLSI systems that implement models of neural systems (for perception, motor control, or sensory processing) as well as software algorithms.

A memristor may be a two-terminal element in which magnetic flux $\phi_m$ between the terminals is a function of the amount of electric charge q that has passed through the memristor. A memristor may be characterized by its memristance function, which describes the charge-dependent rate of change of flux with charge:

$$M(q) = \frac{d\Phi_m}{dq}$$

Since magnetic flux is the time integral of voltage, and charge is the time integral of current, the memristance function may be written as:

$$M(q(t)) = \frac{\frac{d\Phi_m}{dt}}{\frac{dq}{dt}} = \frac{V(t)}{I(t)}$$

Thus, memristance may be considered charge-dependent resistance. If the memristance function is a constant, then by Ohm's law, $R(t)=V(t)/I(t)$. If the memristance function is not constant, or nearly so, however, the equations are not equivalent because $q(t)$ and $M(q(t))$ will vary with time.

The memristance function thus defines a linear relationship between current and voltage, as long as charge does not vary. Of course, nonzero current implies time varying charge. Alternating current, however, may show the linear dependence in circuit operation by inducing a measurable voltage without net charge movement as long as the maximum change in q does not cause much change in M.

Furthermore, the memristor is static if no current is applied. If $I(t)=0$, then $V(t)=0$ and $M(t)$ is constant. This is the essence of the memory effect of a memristor. The memristor's power consumption characteristic follows that, $I^2R$, of a resistor. Thus:

$$P(t)=I(t)V(t)=I^2(t)M(q(t))$$

As long as $M(q(t))$ varies little, such as under alternating current conditions, the memristor will appear as a resistor. If $M(q(t))$ increases rapidly, however, current and power consumption will quickly stop.

For some memristors, applied current or voltage will cause a large change in resistance. Such memristors may be characterized as switches considering the time and energy needed to achieve a desired change in resistance. For a memristor to switch from the resistance ON state ($R_{on}$) to the resistance OFF state ($R_{off}$) in time $T_{on}$ to $T_{off}$, the charge must change by $\Delta Q=Q_{on}-Q_{off}$. Assuming that the applied voltage remains constant, the energy required for switching is the integral of $dt/M(q(t))$ over the time interval $T_{on}$ to $T_{off}$.

Memristance is displayed when enough charge has passed through the memristor that the ions can no longer move, and the memristor device enters hysteresis. Mathematically, this condition is defined by keeping q at an upper bound and M fixed. The memristor then acts as a resistor until current is reversed.

A memristor may be implemented as a nano-scale device, based on the behavior of nano-scale thin films. In an embodiment, a solid-state memristor is combined into devices called crossbar latches, which could replace transistors in computers, taking up a much smaller area because the memristor devices that make up a crossbar latch potentially can be made far smaller than any transistor. Thus crossbar latches allow much the same functionality as transistors, except they do so on a molecular scale.

Nano-scale memristors also can be fashioned into non-volatile solid-state memory, which would allow greater data density than hard drives but with access times potentially similar to DRAM, thereby being capable of replacing both components.

FIG. 1 illustrates a graphene layer that may be used in nano-scale memristors. In FIG. 1, graphene layer 10 can be seen to consist of a single atom-thick layer of carbon atoms, with each carbon atom linked in a hexagonal relationship with adjoining carbon atoms or honeycomb lattice structure. Such a graphene layer 10 may be referred to as a two-dimensional carbon crystal. The graphene layer 10 has a number of physical and electrical properties that make it an excellent material when used in a nano-scale device, such as a nano-scale switch or memory element. When no voltage is applied across it, the graphene layer 10 acts as a near perfect filter. However, in the presence of applied voltage, ions may migrate across the graphene layer 10. Because the graphene layer 10 is very thin, in the nano-scale range, the time for ions to diffuse across the graphene layer 10 is small.

Although FIG. 1 illustrates a graphene layer (i.e., a single carbon-atom thick structure), in some embodiments of a nano-scale memristor, a structure having more than one graphene layers may be used. A structure having more than one graphene layer may be referred to as graphite, where the layers are separated by a gap, which may be the normal 0.335 nm gap that exists between layers in graphite. Alternately, a structure having more than one graphene layer may include two (or more) graphene layers separated by another material, such as a dielectric material. As used hereinafter, a "graphene structure" refers to one or more graphene layers, separated by a gap or by another material, while a "graphene layer" has its ordinary meaning of a single carbon-atom layer.

Because of its filtering effect, a perfect graphene layer presents a very high barrier to the mobility of ions. When the graphene layer is paired with a memristive material such as $TiO_2$, and when the graphene layer includes certain engineered defects, ion conduction paths may be established "below" the engineered defects such that paths for electrons between two electrodes of the memristor can be established. An ion conduction path, due to the memory effect of the $TiO_2$, will remain even when power is removed from the memristor. Thus, the memristor can maintain its ON state (or OFF state) even when power to the memristor is removed.

Defects can be naturally occurring or may be engineered into the graphene layer. In the realm of semi-conductors, in an embodiment, any defects in the graphene layer are engineered by, for example, displacing one or more carbon atoms and/or adding an impurity to the graphene layer.

Figure 2A:
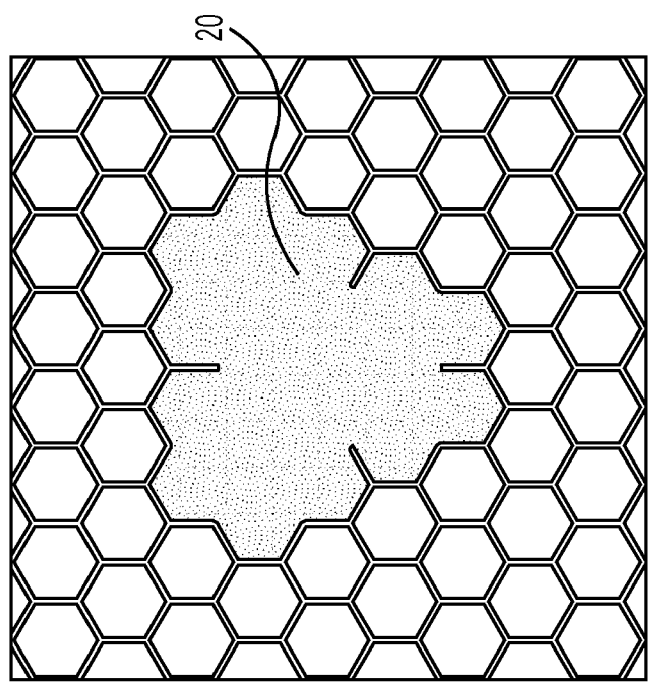
FIGS. 2A and 2B illustrate engineered defects in a graphene layer.
Figure 2B:
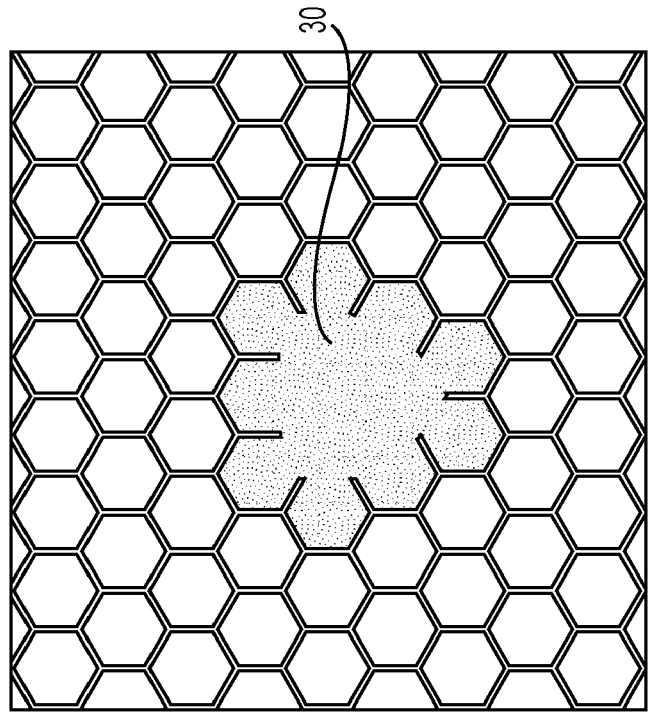

The above mentioned engineered, defects produce nanopores through which ions can migrate, in the presence of an electric field. FIGS. 2A and 2B illustrate nanopores in a graphene layer. In FIG. 2A, a graphene layer is shown with nanopore 20, which is formed by ion etching and local oxidation using negatively charged nitrogen and fluorine. The thus-formed nanopore 20 favors passage of cations. In FIG. 2B, a graphene layer includes nanopore 30, which is formed by ion etching followed by local oxidation using positively charged hydrogen ions. Nanopore 30 favors passage of anions.

Figure 3A:
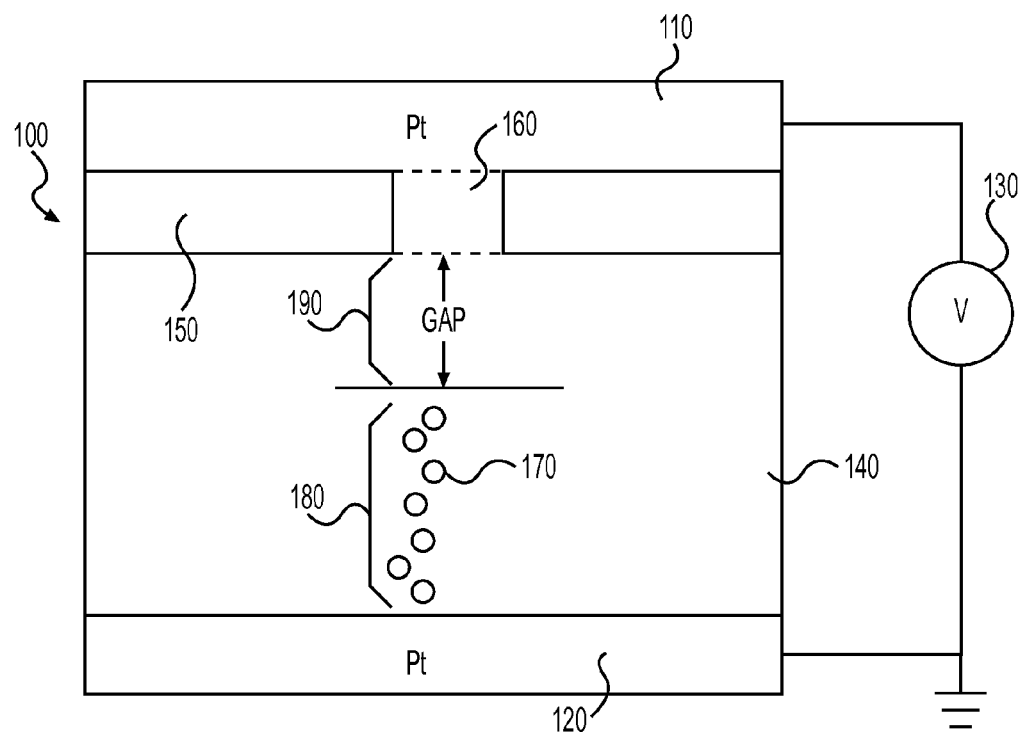
FIGS. 3A and 3B illustrate the structure and operation of an exemplary graphene-based memristor.
Figure 3B:
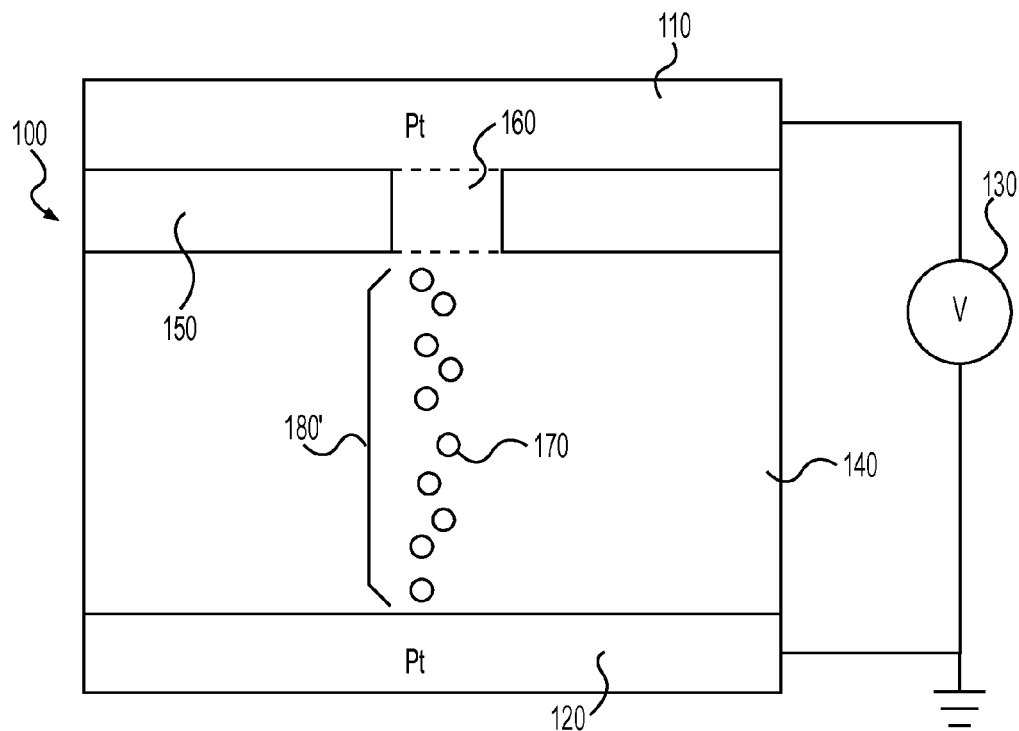

FIGS. 3A-3B illustrate an exemplary graphene-based memristor showing the formation of an ion conducting channel. In an embodiment, the defective graphene-based memristor is a nano-scale memristor employing an exemplary (i.e., defective) graphene layer that allows for modulating conductance across the graphene layer.

In FIG. 3A, memristor 100 comprises a first or top electrode 110 and a second or bottom electrode 120, both of which are formed from platinum as shown. Alternatively, the electrodes 110, 120 may be formed from tungsten or titanium or any other suitable electrode material. The electrodes 110, 120 may be on the order of 5 nm thick or thicker. Voltage source 130 connects to each of the top electrode 110 and the bottom electrode 120 and ground to induce an electric field in the memristor 100. The induced electric field can be used to cause a switch of the memristor 100 from an ON (conducting) state to an OFF (resistive, or non-conducting) state, and from the OFF state to the ON state. Interspersed between the electrodes 110 and 120 is defective graphene structure 150, and memristive material 140. The defective graphene layer 150 includes nanopore 160, which is, in an embodiment, an engineered defect. In the embodiment shown, only one such nanopore 160 exists. Other embodiments may use more than one nanopore. Furthermore, the nanopore 160 shown in FIG. 3A is, in some embodiments, less than 20 nm in diameter, and, in other embodiments is in the range of 1 nm to 20 nm in diameter. Note, however, that the nanopore 160 need not be a circle, let alone a perfect circle, and the <20 nm dimension may represent the major axis or principal dimension of the nanopore 160. See FIGS. 2A and 2B. Since switching current flow in a memristor can lead to excessive heat, which can damage the memristor, the <20 nm size of the nanopore 160 means that the memristor 100 can be operated at a lower current, with a corresponding lower heat load created in the memristor 100. Low current also leads to low power consumption, which is very desirable for highly dense nano-scale memristor applications.

The memristive material, or layer, 140 comprises a thin film of a material that is electronically semiconducting or nominally electronically insulating and also a weakly ionic conductor. The memristive material 140 is capable of transporting and hosting ions that act as dopants to control the flow of electrons through the memristor 100. To operate (switch) the memristor 100, an electric field, which exceeds a threshold for enabling the motion of the ions, is formed via the voltage source 130 in the memristor 100. The electric field is large enough to cause an ionic species to be transported across the memristive material 140. The ionic species are specifically chosen from those that act as electrical dopants for the memristive material 140, and thereby change the electrical conductivity of the memristive material 140 from low conductivity (i.e. an undoped semiconductor or insulator, switch-OFF configuration) to high conductivity (doped to provide a higher conductivity, switch-ON configuration) or from high electrical conductivity to low conductivity (switch-ON to switch-OFF). In one embodiment, cation species may be used, which become electron donors. Alternately, anion species may be used, which become electron acceptors. Furthermore, the memristive material 140 and the ion species are chosen such that the drift of the ions across the memristive material 140 is possible but not too easy, to ensure that the memristor 100 remains in whatever state (ON or OFF) to which it is set for a reasonably long time, perhaps many years at room temperature. The memristor 100 is shown as a two-terminal device, and applying a sufficiently high voltage to the memristor 100 causes both electron current and ion current to flow. When a low voltage is applied, the flow of ions is negligible, but electron flow exists, allowing the memristor 100 to hold its resistance state while reading the state (value) set in the memristor 100.

The memristive material 140 may be less than 50 nm thick, and is in many cases nanocrystalline, nanoporous or amorphous. The mobility of the ion species in such nanostructured materials is much higher than in a bulk single crystal material, since diffusion can occur through grain boundaries, pores or through local structural imperfections in these materials. Also, because the film is so thin, little time is required to drift enough ions through the memristive material 140 to substantially change its conductivity.

The memristive material 140 may be contacted (as shown in FIG. 3A) by platinum metal electrode 120. Contact of the electrode 120 with the memristive material depletes the memristive material 140 of free charge carriers, so that the memristive material has a net charge that depends on the identity of the ions—positive in the case of donors and negative in the case of acceptors. This contact region electrically resembles a Schottky barrier; however, since the memristor 100 is structured at the nanometer scale, structural and electrical properties are not averaged over the large distances over which the theory of semiconductor-metal contacts has been developed.

The memristive material 140 is, in some embodiments, a weakly ionic conductor. If the mobility of ionized species in a lattice is very high, so is the diffusion constant. In some embodiments, the memristor 100 is expected to stay in a particular state, ON or OFF, for an amount of time that may range from a fraction of a second to years, depending on the application. Thus, the diffusion constant for the memristor 100 should be, in an embodiment, low enough to ensure the desired level of stability, to avoid inadvertently turning the memristor 100 from ON to OFF or vice versa via ionized species diffusion, rather than by intentionally setting the state of the memristor 100 with an electrical field. Therefore, the memristive material 140 may be a weakly ionic conductor, one in which ion mobility, and thus the diffusion constant, is small enough to ensure the stability of the ON or OFF state of the memristor 100 for as long as necessary under the desired conditions (e.g., the memristor 100 does not change state because of diffusion of the ions).

In an embodiment of the memristor 100 shown in FIG. 3A, the memristive material 140 is $TiO_2$, and the ion source is $TiO_{2-x}$. The formula $TiO_{2-x}$ indicates that the titanium dioxide has a small deficit of oxygen atoms in the crystal structure; the sites where the missing oxygen atoms would be are positively charged vacancies. The ionic species in this case is an oxygen vacancy 170. The oxygen vacancies 170 act as electron donors. When an electric field is applied, the oxygen vacancies 170 drift, changing the resistance of the titanium dioxide memristive material 140. Thus the resistance of the memristive material 140 depends on how much charge has been passed through the memristive material 140 in a particular direction, which is reversible by changing the direction of current. More specifically, when the voltage source 130 is used to apply a sufficiently large voltage to the memristor 100, the oxygen vacancies 170 tend to form an ion conducting channel 180 under the nanopore 160. Furthermore, the ion conducting channel 180 has a diameter substantially the same as the diameter of the nanopore 160. The ion conducting channel 180 provides a means for electron flow between the electrodes 110 and 120.

In other embodiments, the memristive material may be one of the nitrides (e.g., AlN, GaN, etc.) phosphates (e.g., InP, etc.) sulfides (e.g., $CuS_2$), and the ions may be N vacancies, P vacancies, and S vacancies.

As can be seen in FIG. 3A, in which a sufficient switching voltage has not been applied to the memristor 100, the ion conducting channel 180 terminates short of the graphene layer 150 leaving a gap 190. The gap 190 presents a high barrier to movement of electrons between the electrodes 110 and 120, resulting in an OFF (non-conducting) state. To establish a complete ion conducting channel, a sufficient switching voltage is applied to the memristor 100. The result is shown in FIG. 3B in which ion conducting channel 180' now extends from the bottom electrode 120 to just beneath the graphene layer 150, thereby eliminating the gap 190 and removing the barrier to the flow of electrons. As shown in FIG. 3B, the memristor 100 with the complete ion conducting channel 180' is in the ON (conducting) state. Furthermore, the memristor 100, because of its memristive function, remains in the ON state until an opposing switching voltage is applied to the memristor 100, or until a sufficient time elapses (on the order of years). Thus, when power is removed from the memristor 100, the memristor "remembers" its resistance value, and remains in this condition.

We claim:
1. A defective graphene-based memristor, comprising:
 a first electrode;
 a defective graphene structure adjacent the first electrode, the defective graphene structure comprising a defective graphene layer having one or more engineered defects, wherein an engineered defect comprises a nanopore;
 a memristive material adjacent the defective graphene structure, the memristive material comprising a plurality of ions;
 a second electrode adjacent the memristive material; and
 a voltage source that generates an electric field between the first and the second electrodes, wherein the plurality of ions in the memristive material, under the influence of the electric field, form an ion conducting channel between the second electrode and the defective graphene structure.

2. The graphene memristor of claim 1, wherein an engineered defect comprises one or more of interstitial atoms and removed carbon atoms.

3. The graphene memristor of claim 1, wherein the nanopore has a nominal diameter of less than 20 nm.

4. The graphene memristor of claim 1, wherein the ion conducting channel forms under the nanopore and has a diameter substantially the same as the nanopore.

5. The graphene memristor of claim 1, wherein the weakly ionic conductor is $TiO_2$ and the ions are oxygen vacancies in the $TiO_2$.

6. The graphene memristor of claim 1, wherein when the ion conducting channel is complete between the defective graphene layer and the second electrode, the graphene memristor is in an ON state.

7. A defective nano-scale graphene-based memristor, comprising:
 a first electrode;
 a second electrode electrically coupled to the first electrode through a voltage source;
 a defective graphene structure comprising a defective graphene layer adjacent the first electrode and comprising one or more engineered nanopores; and
 a memristive material interspersed between the defective graphene layer and the second electrode, the memristive material including a plurality of ions, wherein application of a voltage using the voltage source causes the ions to form a conducting channel between each of the nanopores and the second electrode, whereby the defective nano-scale graphene-based memristor is switched from a first state to a second state.

8. The defective nano-scale graphene-based memristor of claim 7, wherein the memristive material is a weakly ionic conductor chosen from a group consisting of nitrides, phosphates, and sulfides.

9. The defective nano-scale graphene-based memristor of claim 8, wherein the memristive material is $TiO_2$ and the ions are oxygen vacancies.

10. A defective graphene-based memristor, comprising:
 a first electrode; a second electrode;
 means for applying a switching potential to the first and the second electrodes; and means for switching the graphene memristor from an OFF state to an ON state comprising one or more engineered nanopores in a defective graphene structure, wherein the graphene memristor remains in a most recent one of the OFF state and the ON state when the potential is removed from the graphene memristor.

11. The graphene-based memristor of claim 10, wherein the means for switching, comprises:
   a weakly ionic conductor adjacent the second electrode; and
   the defective graphene structure interspersed between the first electrode and the conductor.

12. The graphene-based memristor of claim 11, wherein the conductor is $TiO_2$ having a plurality of oxygen vacancies.

13. The graphene-based memristor of claim 12, wherein the oxygen vacancies are provided by incorporation of $TiO_{2-x}$ in the conductor.

14. The graphene-based memristor of claim 10, wherein each of the one or more engineered nanopores has a principal dimension of less than 20 nm.

15. The graphene-based memristor of claim 10, wherein the defective graphene structure is a graphene layer.

16. The graphene-based memristor of claim 10, wherein the defective graphene structure is graphite.

17. The graphene-based memristor of claim 10, wherein the defective graphene structure comprises a dielectric material between two graphene layers of the graphite.

* * * * *